(12) United States Patent
Brosowski

(10) Patent No.: US 6,661,675 B2
(45) Date of Patent: Dec. 9, 2003

(54) DEVICE AND BRIDGE CARD FOR A COMPUTER

(75) Inventor: Hans-Otto Brosowski, Korntal-Muenchingen (DE)

(73) Assignee: Hartmann Elektronik GmbH, Stuttgart (DE)

( * ) Notice: Subject to any disclaimer, the term of this patent is extended or adjusted under 35 U.S.C. 154(b) by 42 days.

(21) Appl. No.: 10/048,262

(22) PCT Filed: Mar. 30, 2001

(86) PCT No.: PCT/EP01/03670

§ 371 (c)(1), (2), (4) Date: Jan. 28, 2002

(87) PCT Pub. No.: WO02/03769

PCT Pub. Date: Jan. 10, 2002

(65) Prior Publication Data

US 2003/0007338 A1 Jan. 9, 2003

(30) Foreign Application Priority Data

Jul. 4, 2000 (DE) .......................... 100 32 339

(51) Int. Cl.$^7$ .................................. H05K 1/14
(52) U.S. Cl. .................... 361/785; 361/788; 361/790; 439/74
(58) Field of Search ................. 361/775, 785, 361/788, 790, 791, 803; 710/301, 306; 439/65, 74

(56) References Cited

U.S. PATENT DOCUMENTS

| | | | |
|---|---|---|---|
| 4,683,550 A | * | 7/1987 | Jindrick et al. ............. 708/140 |
| 5,006,961 A | | 4/1991 | Monico ...................... 361/775 |
| 5,014,163 A | * | 5/1991 | Lin ............................ 361/796 |
| 5,308,926 A | | 5/1994 | Auerbuch et al. .......... 361/788 |
| 5,848,252 A | * | 12/1998 | Granau et al. ............. 710/306 |
| 6,067,594 A | | 5/2000 | Perino et al. .............. 710/301 |
| 6,526,465 B1 | * | 2/2003 | Voth et al. ................. 710/301 |
| 2002/0085361 A1 | * | 7/2002 | Wachel ....................... 361/803 |

FOREIGN PATENT DOCUMENTS

| | | |
|---|---|---|
| DE | 28 06 762 | 8/1979 |
| DE | 44 25 726 | 2/1995 |

* cited by examiner

Primary Examiner—John B. Vigushin
(74) Attorney, Agent, or Firm—Harness, Dickey & Pierce, P.L.C.

(57) ABSTRACT

Described is a computer having two circuit boards (10, 11) on which plug connectors (15) are present for plug-in cards (16) which project above the circuit boards (10, 11) to a first height (H1). There is a bridge card (19), which is plugged into the two circuit boards (10, 11), connecting the two circuit boards (10, 11) electrically, and which project above the circuit boards (10, 11) to a second height (H2). The bridge card (19) is connected to the two circuit boards independently of the plug connectors (15), and the first height (H1) is greater than the second height (H2).

13 Claims, 2 Drawing Sheets

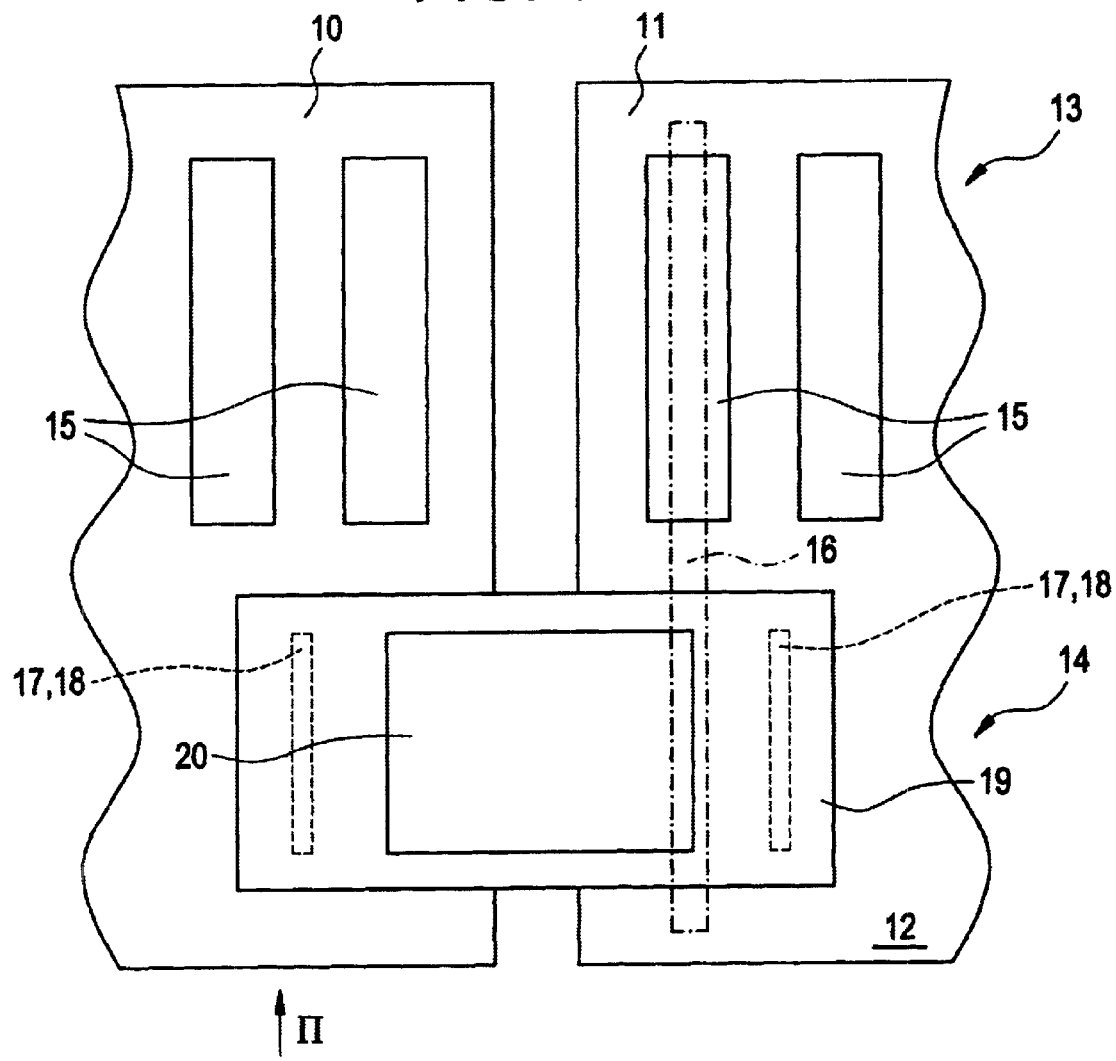

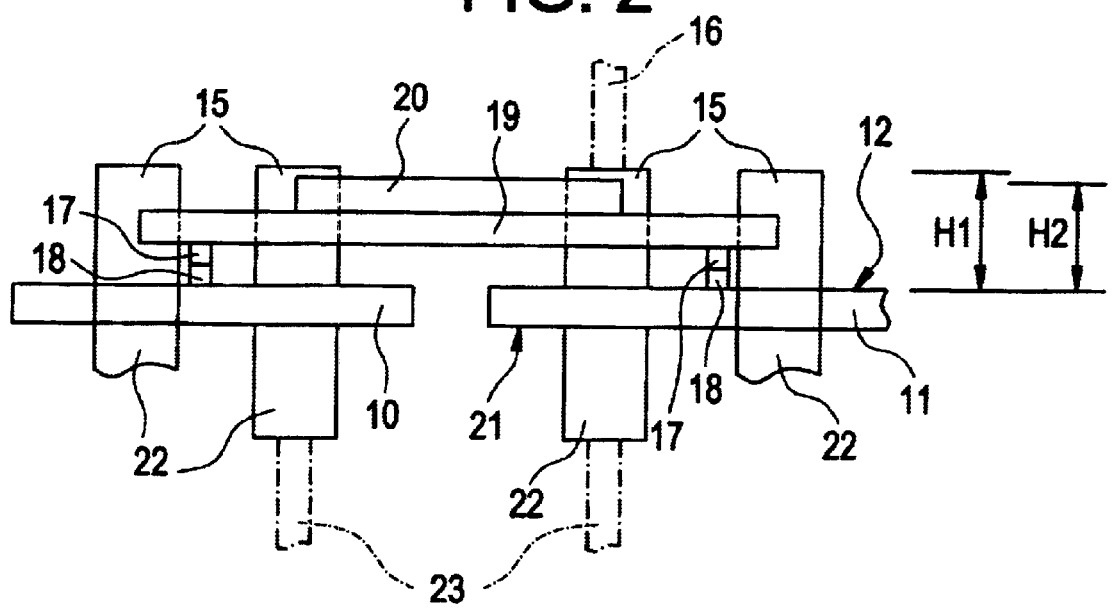

DEVICE AND BRIDGE CARD FOR A COMPUTER

This application is the national phase under 35 U.S.C. §371 of prior PCT International Application No. PCT/EP01/03670 which has an International filing date of Mar. 30, 2000, which designated the United States of America, the entire contents of which are hereby incorporated by reference.

BACKGROUND OF THE INVENTION

1. Field of the Invention

STATE OF THE ART

This invention relates to a device for a computer having at least two circuit boards on which there are plug connectors, for plug-in cards, which project at a first height above the circuit boards, and having a bridge card which is plugged into the two circuit boards and by means of which the two circuit boards are connected together electrically, and which projects at a second height above the circuit boards. This invention also relates to a corresponding bridge card for a computer.

2. Related Art

Such a device is known for use with a personal computer, for example, where two so-called bus cards are connected together electrically and functionally by a bridge card. With the help of a bridge card, it is possible to increase the number of plug-in slots made available by the bus cards. Plug-in cards such as adapter cards for devices connected to the computer may be plugged into these plug-in slots.

It is known that the bridge card is equipped with mating connectors, which can be inserted into the plug connectors on the two circuit boards. When plugged in, the bridge card thus occupies one plug connector on each of the two circuit boards.

The bridge card is usually provided with an integrated chip, which provides the electric and functional connection for the two circuit boards. In particular, the chip is suitable for generating selector signals for selecting certain plug-in slots and transmitting them between the circuit boards.

As a result of the structural size of the chips, the bridge card covers not only both of the plug connectors of the circuit boards on which it is installed but also the next two plug connectors on the two circuit boards. This means that the bridge card occupies a total of four plug connectors on the two circuit boards rather than just two.

The disadvantage of the known bridge card is, therefore, that its presence is automatically associated with plug-in slots on both circuit boards being occupied. Accordingly, additional plug-in cards may not be plugged into these plug-in slots, so that the increase in available plug-in slots that can be achieved with the help of a bridge card is not actually achieved in the related art.

SUMMARY OF THE INVENTION

The object of the present invention is to create a device or a bridge card for a computer in which all possible plug-in slots are in fact also available.

The object of the present invention is achieved by providing a bridge card that is connected to two circuit boards, independently of the plug connectors, and by way of having a first height that is greater than a second height.

In other words, this means that the bridge card is no longer plugged into the plug connectors of the two circuit boards. This alone yields the result that two more plug-in slots are available as compared with that available in the related art.

In addition, as a result of the size ratios of the two heights relative to one another, the bridge card projects above the circuit board less, as a whole, than the plug connectors into which the plug-in cards are plugged. Thus, the plug-in cards can be plugged into the plug connectors of the circuit boards without colliding with the bridge card in any way. If plug-in cards are plugged into the plug connectors of the two circuit boards, the bridge card is thus ultimately below the plug-in cards when plugged in. Therefore, plug-in slots are no longer blocked by the bridge card.

On the whole, the present invention yields the result that the number of plug-in slots that can possibly be achieved is in fact achieved through use of a bridge card according to the present invention. Thus, no plug-in slots are wasted because of the bridge card. This has obvious advantages from the standpoint of computer design and especially with regard to the resulting costs.

By way of advantageous refinements of the present invention, the two circuit boards may be arranged side by side having a specific distance between them and substantially in a common plane and/or the bridge card may be arranged substantially parallel to the circuit boards.

An especially advantageous embodiment of the present invention is that the bridge card is equipped with at least two mating connectors; the two circuit boards are each equipped with at least one plug connector into which the mating connectors of the bridge card are plugged, and the two circuit boards are connected electrically to the bridge card by the plug connectors and the mating connectors.

Thus, separate plug connectors and mating connectors are provided for connecting the bridge card to the two circuit boards. This makes it possible for these plug connectors and mating connectors to be designed very flat or small. Therefore, the second height remains smaller than the first height. Thus, ultimately, the present invention is implemented by suitably designed plug connectors and mating connectors.

The present invention is also implemented by way of a bridge card for a computer, wherein the computer is equipped with at least two circuit boards on which there are plug connectors, for use with plug-in cards which project above the circuit boards at a first height, wherein a bridge card can be plugged into the two circuit boards, wherein the two circuit boards can be interconnected electrically by the plugged-in bridge card, and wherein the plugged-in bridge card projects with a second height above the circuit boards. According to the present invention, the bridge card is connected to the two circuit boards, independently of the plug connectors, and the bridge card is designed so that the second height is smaller than the first height.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 illustrates a schematic top view of an embodiment of a device according to the present invention for a computer; and FIG. 2 illustrates a schematic side view of the device from FIG. 1 as seen from direction II.

DETAILED DESCRIPTION OF THE PREFERRED EMBODIMENTS

FIGS. 1 and 2 illustrate two circuit boards 10, 11 for a computer. The circuit boards 10, 11 are in particular so-called bus cards of an industrial or personal computer. The circuit boards 10, 11 are arranged side by side, substantially in the same plane, with a specific distance between them.

FIG. 1 further illustrates back sides 12 of the circuit boards 10, 11. In the case of bus card, the back side 12 is divided into an upper area 13 and a lower area 14.

Plug connectors 15 provided in the upper area 13 of the back side 12 are mounted on the circuit boards 10, 11 and project a distance away from them. Plug-in cards such as adapter cards for a printer or the like to be connected can be plugged into the plug connectors 15. Such a plug-in card, in the plugged in state, is illustrated as an example with dash-dot lines in FIGS. 1 and 2, and is labeled with reference number 16.

In the lower area 14 of the back side 12, there are plug connectors 18 which are also mounted on circuit boards 10, 11 and project away from them. Mating connectors 17, which are mounted on the lower side of a bridge card 19 and extend away from it, are plugged into the plug connectors 18.

An integrated chip 20 is present on the top side or on the lower side of the bridge card 19. The two circuit boards 10, 11 are connected electrically and functionally to one another by the bridge card 19 and with the help of the chip 20.

Two such mating connectors 17 are present on the bridge card 19. Each of the two mating connectors 17 is provided for one plug connector 18 of one of the two circuit boards 10, 11. This yields an electric connection of the circuit board 10 to the bridge card 19 by way of the plug connector 18 and mating connector 17, and from the bridge card 19 to the circuit board 11 by way of the chip 20, mating connector 17 and plug connector 18.

The bridge card 19 is arranged approximately parallel to the two circuit boards 10, 11. In addition, bridge card 19 overlaps each of the two circuit boards 10, 11 within the lower area 14. The bridge card 19 extends approximately up to the second plug connector 15 of the two circuit boards 10, 11.

The plug connectors 15, plug connectors 18 and mating connectors 17 are aligned approximately parallel to one another. The plug connectors 18 with mating connectors 17 are arranged approximately in the middle between two plug connectors 15. A plug connector 18 with a mating connector 17 plugged into it is provided on the circuit board 10 and on the circuit board 11. The plug connector 18 and/or the mating connector 17 may be designed in two parts here.

Additional plug connectors 22 are provided on a front side 21 of the circuit boards 10, 11. Additional plug-in cards, which are illustrated using dash-dot lines in FIG. 2 as an example, are labeled with reference number 23, can also be plugged into plug connectors 22. One of these plug-in cards may be a CPU card, which thus carries the processor of the entire computer.

The pins of the plug connectors 22 of the front side 21 are connected electrically to one another on each of the two circuit boards 10, 11 and form a bus on each of the two circuit boards 10, 11. The printed conductors of this bus are arranged substantially in the lower area 14 of the circuit boards 10, 11. In addition, in the upper area 13 of the circuit boards 10, 11, each of the plug connectors 15 on the back side 12 is connected by way of pins to the opposing plug connector 22 on the front side 21.

The distance between the plug connectors 15, 22 is 20.32 mm. The two circuit boards 10, 11 are arranged side by side in such a way that the spacer grid formed by the plug connectors 15, 22 is preserved. The bridge card 19 is preferably also adapted to this spacer grid.

On each of the two circuit boards 10, 11, the above-mentioned bus and optionally other pins of the plug connectors 15, 22, which are connected together, are connected electrically to the pins of the plug connector 18 belonging to the respective circuit boards 10, 11.

The pins of the two mating connectors 17 present on the bridge card 19 are interconnected by the chip 20. The chip 20 is an electronic module, which is suitable for processing signals arriving at the mating connectors 17. The chip 20 is thus suitable for generating so-called selector signals for the individual plug-in cards 16 of the two circuit boards 10, 11, for example, and/or transmitting the signals between the two circuit boards 10, 11.

As illustrated in FIG. 2, the plug connectors 15 have a certain first height H1 by which they project above the circuit boards 10, 11. In addition, the plug connectors 18, the mating connectors 17, the bridge card 19 and the chip 20 together have a certain second height H2 by which they project above the circuit boards 10, 11. If the chip 20 is on the lower side of the bridge card 19, it does not contribute anything toward the second height H2.

As illustrated in FIG. 2, the first height H1 is greater than the second height H2.

This is achieved in particular by the fact that the plug connectors 18 and the mating connectors 17 are designed to be flat or small enough so that the total second height H2 remains smaller than the first height H1.

In selecting the second height H2, it may be necessary to take into account the fact that the plug-in cards 16 which are inserted into the plug connectors 15 project slightly above the plug connectors 15 and thus reduce the first height H1 accordingly.

The plug-in cards 16 having the bridge card 19 with the chip 20 in the lower area 14 may thus also be plugged into these plug connectors 15. The plug-in cards 16 plugged into these plug connectors 15 are not affected by the bridge card 19 or the chip 20 according to FIG. 2. In particular, the plug-in cards 16 can be plugged completely into the plugs 15 without the plug-in cards 16 coming in contact with the bridge card 19 or the chip 20. The bridge card 19 and the chip 20 are then completely beneath the plug-in cards 16 which are plugged into these plug connectors 15.

It is pointed out explicitly here that the two circuit boards 10, 11 may also be present in the form of a single circuit board. In this case, there are two halves on one circuit board which correspond essentially to the two circuit boards 10, 11. These two halves can then be linked together in the same way as the two circuit boards 10, 11 namely by a bridge card which is installed on the circuit board.

In addition, it should be pointed out that the circuit boards 10, 11 as well as the combined circuit board described above can also be cascaded with multiple boards.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for a computer, comprising at least two circuit boards (10, 11) on which plug connectors (15) for plug-in cards (16) which project above the circuit boards (10, 11) are disposed, the plug connectors (15) having a first height (H1); and a bridge card (19) connected to the two circuit boards (10, 11), the bridge card (19) connects the two circuit boards (10, 11) electrically and projects above the circuit boards (10, 11) with a second height (H2), wherein the bridge card (19) is connected to the two circuit boards independently of the plug connectors (15), and the first height (H1) is greater than the second height (H2).

2. The device according to claim 1, wherein the two circuit boards (10, 11) are arranged side by side with a specific distance between them, and are arranged substantially in the same plane.

3. The device according to claim 1, wherein the bridge card (19) is arranged substantially in parallel with the circuit boards (10, 11).

4. The device according to claim 1, wherein the bridge card (19) is provided with at least two mating connectors (17), the two circuit boards (10, 11) are each provided with at least one plug connector (18) into which are plugged the mating connectors (17) of the bridge card (19), and the two circuit boards (10, 11) are connected electrically to the bridge card (19) by the at least one plug connector (18) and the mating connectors (17).

5. The device according to claim 4, wherein the at least one plug connector (15) for the plug-in cards, the plug connectors (18) and the mating connectors (17) are arranged approximately in parallel with one another.

6. The device according to claim 4, wherein the second height (H2) is determined by the height of the bridge card (19), the at least one plug connector (18), and the mating connectors (17).

7. The device according to claim 6, wherein the second height (H2) is further defined by a chip (20) disposed on the bridge card (19).

8. The device according to claim 1, wherein the bridge card (19) is provided with a chip (20).

9. The device according to claim 1, wherein the plug connectors (15) belong to a PCI bus.

10. The device according to claim 9, wherein the PCI bus is a compact PCI bus.

11. The device according to claim 1, wherein the two circuit boards (10, 11) are a single circuit board.

12. A bridge card (19) for a computer, the computer being provided with at least two circuit boards (10, 11), which have plug connectors (15) for plug-in cards (16) that project above the circuit boards (10, 11) to a first height (H1), the bridge card (19) being pluggable into the two circuit boards (10, 11), the two circuit boards (10, 11) being electrically connectable by way of the plugged-in bridge card (19), and the plugged-in bridge card (19) projecting above the circuit boards (10, 11) to a second height (H2), wherein the bridge card (19) is connected to the two circuit boards (10, 11) independently of the plug connectors (15), and the bridge card (19) is designed so that the second height (H2) is smaller than the first height (H1).

13. The bridge card (19) according to claim 12, wherein the two circuit boards (10, 11) are a single circuit board.

* * * * *